(12) United States Patent
Yen et al.

(10) Patent No.: US 7,501,861 B2
(45) Date of Patent: Mar. 10, 2009

(54) PHASE-DIFFERENCE DETECTING APPARATUS AND METHOD

(75) Inventors: Ming-Hsien Yen, Sinying (TW); Hsin-Chuan Chen, Taipei (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 11/898,043

(22) Filed: Sep. 7, 2007

(65) Prior Publication Data
US 2008/0129344 A1 Jun. 5, 2008

(30) Foreign Application Priority Data
Dec. 4, 2006 (TW) ............... 95145027 A

(51) Int. Cl.
*G01R 25/00* (2006.01)
*H03D 13/00* (2006.01)
(52) U.S. Cl. ............................. 327/12; 327/9
(58) Field of Classification Search ........... 327/12, 327/9
See application file for complete search history.

(56) References Cited
U.S. PATENT DOCUMENTS
2004/0091073 A1* 5/2004 Smith et al. .......... 375/355

\* cited by examiner

*Primary Examiner*—Kenneth B Wells
*Assistant Examiner*—John W Poos
(74) *Attorney, Agent, or Firm*—Rabin & Berdo, P.C.

(57) ABSTRACT

A phase-difference detecting method is for detecting phase difference between a first signal and a second signal of the same frequency. First, generate a detection signal. Next, sample the detection signal respectively according to the first signal and the second signal to obtain a first sample value and a second sample value. Then, determine whether a determination condition that the first and the second sample values are respectively equal to the previous first and second sample values is satisfied. When the determination condition is unsatisfied for the first time, record a delay time of the detection signal as a first time. When the determination condition is unsatisfied for the second time, record a delay time of the detection signal as a second time. Obtain the phase difference between the first signal and the second signal according to the first time and the second time.

13 Claims, 5 Drawing Sheets

US 7,501,861 B2

PHASE-DIFFERENCE DETECTING APPARATUS AND METHOD

This application claims the benefit of Taiwan application Serial No. 095145027, filed Dec. 4, 2006, the subject matter of which is incorporated herein by reference.

BACKGROUND OF THE INVENTION

1. Field of the Invention

The invention relates in general to a phase-difference detecting apparatus, and more particularly to a phase-difference detecting apparatus, which detects phase difference between several targeted signals by delaying the phase of a detection signal.

2. Description of the Related Art

Referring to FIGS. 1A and 1B, a block diagram of a conventional phase-difference detecting apparatus and a timing diagram of relevant signals of the phase-difference detecting apparatus of FIG. 1A are respectively shown. To obtain phase difference between the timing signals CK1 and CK2 with the same frequency and different phases, the timing signals CK1 and CK2 are inputted to an exclusive or (XOR) gate to obtain an exclusive signal XS and the exclusive signal XS and a sample signal SS generated by the signal generator 130 are inputted to a flip-flop 120 to sample the exclusive signal XS by the sample signal SS and obtain a sample result SO. Afterwards, how many periods of the sample signal SS are included in the time when the sample result SO has a high signal level is counted to obtain a delay time TD corresponding to the phase difference between the timing signals CK2 and CK1. Then, the phase difference between the timing signals CK1 and CK2 can be obtained according to the delay time Td and the period of the timing signal CK1. However, the conventional phase-difference detecting apparatus 100 has several disadvantages.

In order to precisely detect the phase difference between the timing signals CK1 and CK2 via the conventional phase-difference detecting apparatus 100, the frequency of the sample signal SS should be very much higher than the frequency of the timing signals CK1 and CK2, such as by more than 20 times. However, in a normal electronic apparatus, most of the timing signals have a frequency close to the maximum frequency permitted in the circuit hardware condition. Therefore, in a normal practical application, the phase difference between the timing signals CK1 and CK2 can be only measured by using a measuring signal SS with a frequency slightly higher than those of the timing signals, which results in lower precision of the measurement result. Besides, to generate the measuring signal SS with a frequency higher than those of the timing signals CK1 and CK2 requires an expensive timing-signal generator 130, which in turn increases the cost of the phase-difference detecting apparatus 100.

SUMMARY OF THE INVENTION

The invention is directed to a phase-difference detecting apparatus and method, which can effectively improve the drawbacks of the conventional phase-difference detecting apparatus with lower measurement precision and higher cost.

According to a first aspect of the present invention, a phase-difference detecting apparatus is provided. The phase-difference detecting apparatus is for detecting phase difference between a first signal and a second signal. The first signal and the second signal have substantially the same frequency. The phase-difference detecting apparatus comprises a signal generator, a sample unit and a comparer. The signal generator is for generating a detection signal and delaying the detection signal by a fixed time in response to a control signal. The sample unit is for respectively sampling the detection signal according to the first signal and the second signal to generate a first sample value and a second sample value. The comparer is for comparing the first sample value with the previous first sample value and comparing the second sample value with the previous second sample value. When the first sample value is substantially equal to the previous first sample value and the second sample value is substantially equal to the previous second sample value, the comparer generates the control signal to drive the signal generator to delay the detection signal by the fixed time. When the first sample value is not equal to the previous first sample value, the phase-difference detecting apparatus records a second time corresponding to difference between the present phase and an initial phase of the detection signal. When the second sample value is not equal to the previous second sample value, the phase-difference detecting apparatus records a second time corresponding to difference between the present phase and the initial phase of the detection signal. The phase-difference detecting apparatus obtains the phase difference between the first signal and the second signal according to the first time and the second time.

According to a second aspect of the present invention, a phase-difference detecting method is provided. The phase-difference detecting method is for detecting phase difference between a first signal and a second signal. The first signal and the second signal have substantially the same frequency. The detecting method comprises generating a detection signal; sampling the detection signal respectively according to the first signal and the second signal to obtain a first sample value and a second sample value; determining whether a determination condition that the first sample value is substantially equal to the previous first sample value and the second sample value is substantially equal to the previous second sample value is satisfied; when the determination condition is unsatisfied, determining whether the determination condition is unsatisfied for the first time; when the determination condition is unsatisfied for the first time, recording difference between the present phase and an initial phase of the detection signal and a first time corresponding to the phase difference; when the determination condition is unsatisfied and is not unsatisfied for the first time, recording difference between the present phase and the initial phase of the detection signal and a second time corresponding to the phase difference; and obtaining the phase difference between the first signal and the second signal according to the first time and the second time.

The invention will become apparent from the following detailed description of the preferred but non-limiting embodiments. The following description is made with reference to the accompanying drawings.

DETAILED DESCRIPTION OF THE INVENTION

The phase-difference detecting apparatus and method of the invention sample the detection signal respectively according to two timing signals. The phase-difference detecting apparatus and method of the invention further find out time difference between sample-triggering edges of the two timing signals from sample values of the two timing signals by delaying phase of the detection signal, and obtain the phase difference of the two timing signals according to the time difference.

Figure 1A:
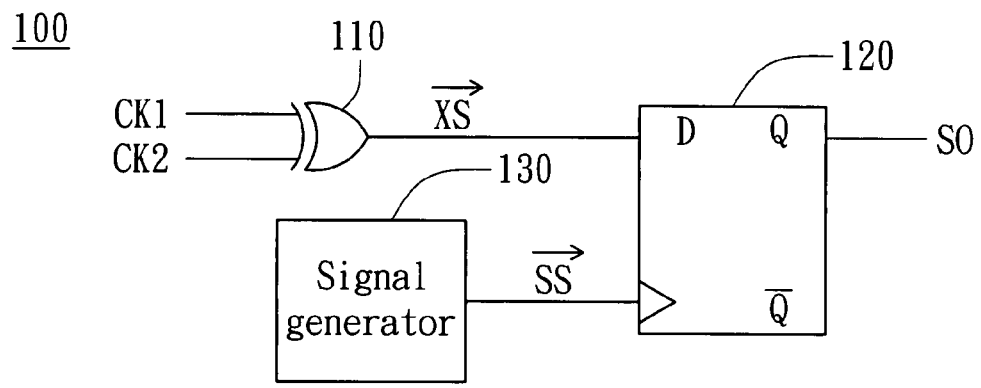
FIG. 1A is a block diagram of a conventional phase-difference detecting apparatus.
Figure 1B:
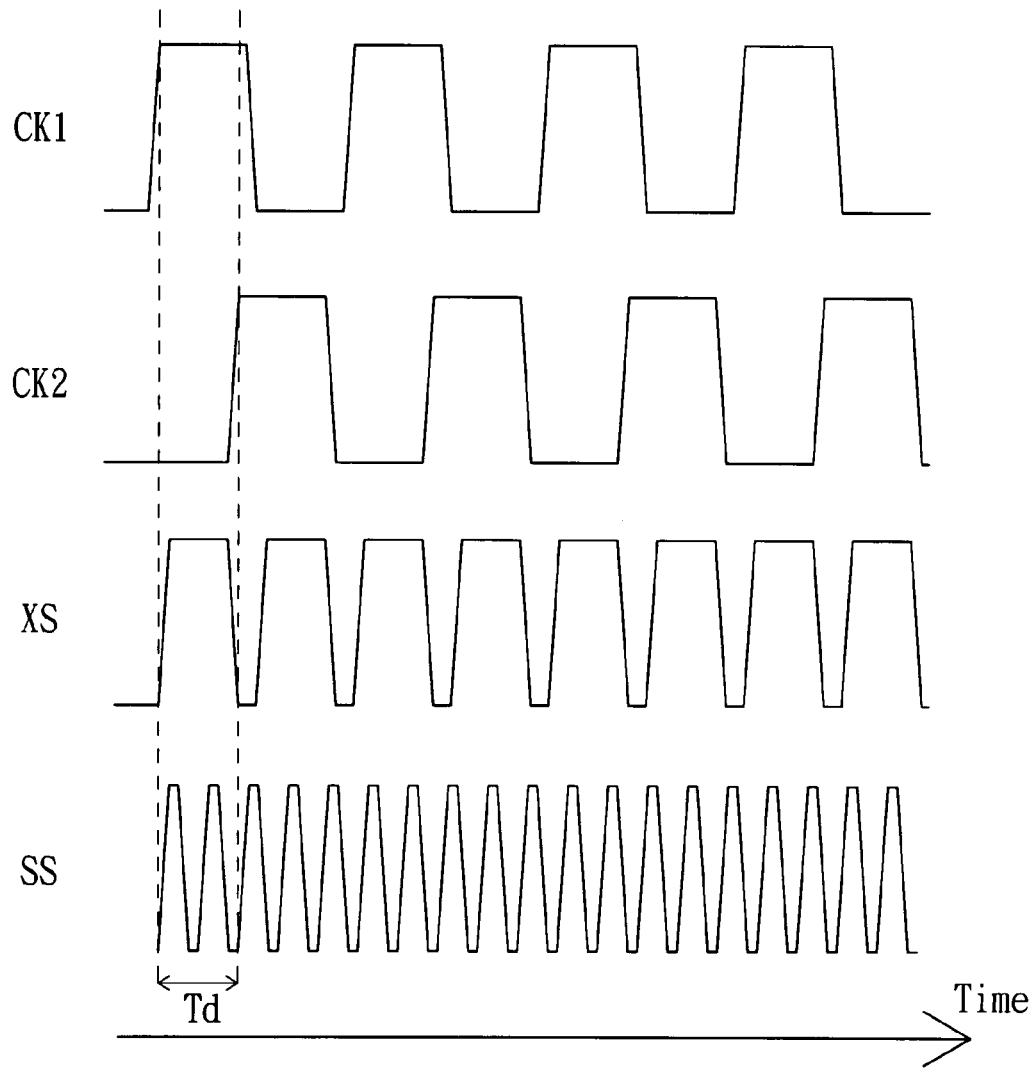
FIG. 1B is a timing diagram of relevant signals of the phase-difference detecting apparatus of FIG. 1A.
Figure 2:
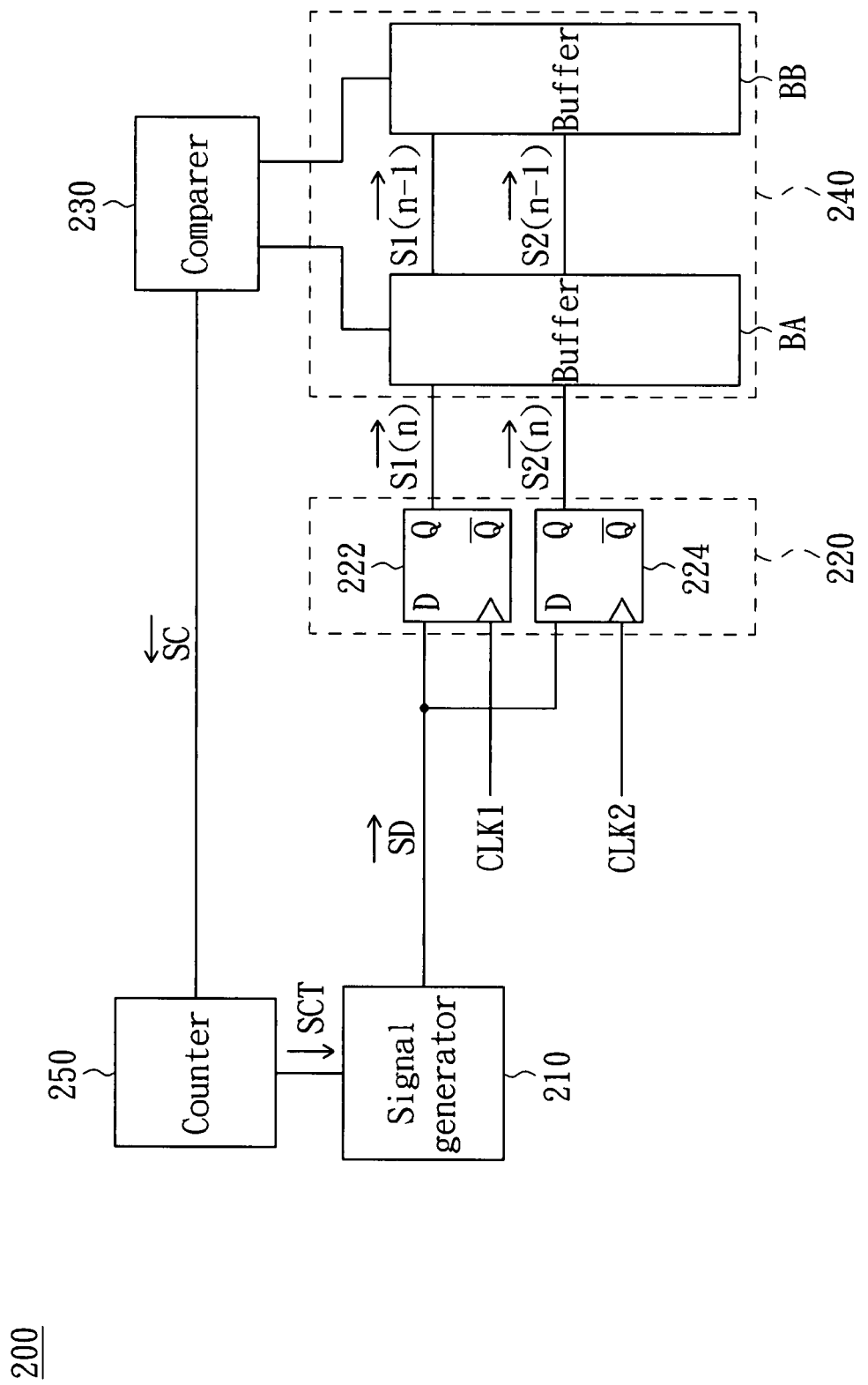
FIG. 2 is a block diagram of a phase-difference detecting apparatus according to a preferred embodiment of the invention.

Referring to FIG. 2, a block diagram of a phase-difference detecting apparatus according to a preferred embodiment of the invention is shown. A phase-difference detecting apparatus 200 includes a signal generator 210, a sample unit 220 and a comparer 230. The signal generator 210 is for generating a detection signal SD and delaying the detection signal SD by a period of fixed time in response to a control signal SC.

The sample unit 220 is for sampling the detection signal SD respectively according to timing signals CLK1 and CLK2 to generate sample values S1($n$) and S2($n$), wherein n is a natural number larger than 1. For example, the sample unit 220 is a positive-edge sample unit. The frequency of the detection signal SD is smaller than or equal to the frequency of the timing signal CLK1. That is, the period of the detection signal SD is larger than or equal to the period of the timing signal CLK1. The fixed time is, for example, equal to one twentieth of the period of the timing signals CLK1 and CLK2.

The comparer 230 is for comparing the sample value S1($n$) with the previous sample value S1($n-1$) and comparing the sample value S2($n$) with the previous sample value S2($n-1$). When the sample value S1($n$) is substantially equal to the previous sample value S1($n-1$) and the sample value S2($n$) is substantially equal to the previous sample value S2($n-1$), the comparer 230 generates the control signal SC to drive the signal generator 210 to delay the detection signal SD by the fixed time i.e. delay the detection signal SD by a corresponding phase. The sample unit 220 repeatedly samples the detection signal SD according to the timing signals CLK1 and CLK2.

When the sample value S1($n$) is not equal to the previous sample value S1($n-1$), the phase-difference detecting apparatus 200 records time data T1 corresponding to difference between the present phase and an initial phase of the detection signal SD. The difference detecting apparatus 200 further determines whether two pieces of time data have been recorded. When the phase-difference detecting apparatus 200 has not recorded two pieces of time data, the comparer 230 continues to generate the control signal SC to drive the signal generator 210 to delay the detection signal SD by the fixed time such that the sample unit 220 can repeatedly sample the detection signal SD according to the timing signals CLK1 and CLK2.

When the sample value S2($n$) is not equal to the sample value S2($n-1$), the phase-difference detecting apparatus 200 records time data T2 corresponding to difference between the present phase and the initial phase of the detection signal SD. At the time, the phase-difference detecting apparatus records two pieces of time data and obtains delay time corresponding to the phase difference between the timing signals CLK1 and CLK2 according to the time data T2 and T1. For example, the difference by subtracting the time data T2 by the time data T1 represents a time delay corresponding to the phase difference of the timing signal CLK2 minus the timing signal CLK1. The phase difference of the timing signal CLK2 minus the timing signal CLK1 is obtained by dividing the value of the time data T2 minus the time data T1 by the period of the timing signal CLK1. Therefore, the phase-difference detecting apparatus 200 of the embodiment can sample the detection signal SD respectively according to the timing signals CLK1 and CLK2 and obtain the phase difference between the timing signals CLK1 and CLK2 by delaying the phase of the detection signal SD.

Figure 3:
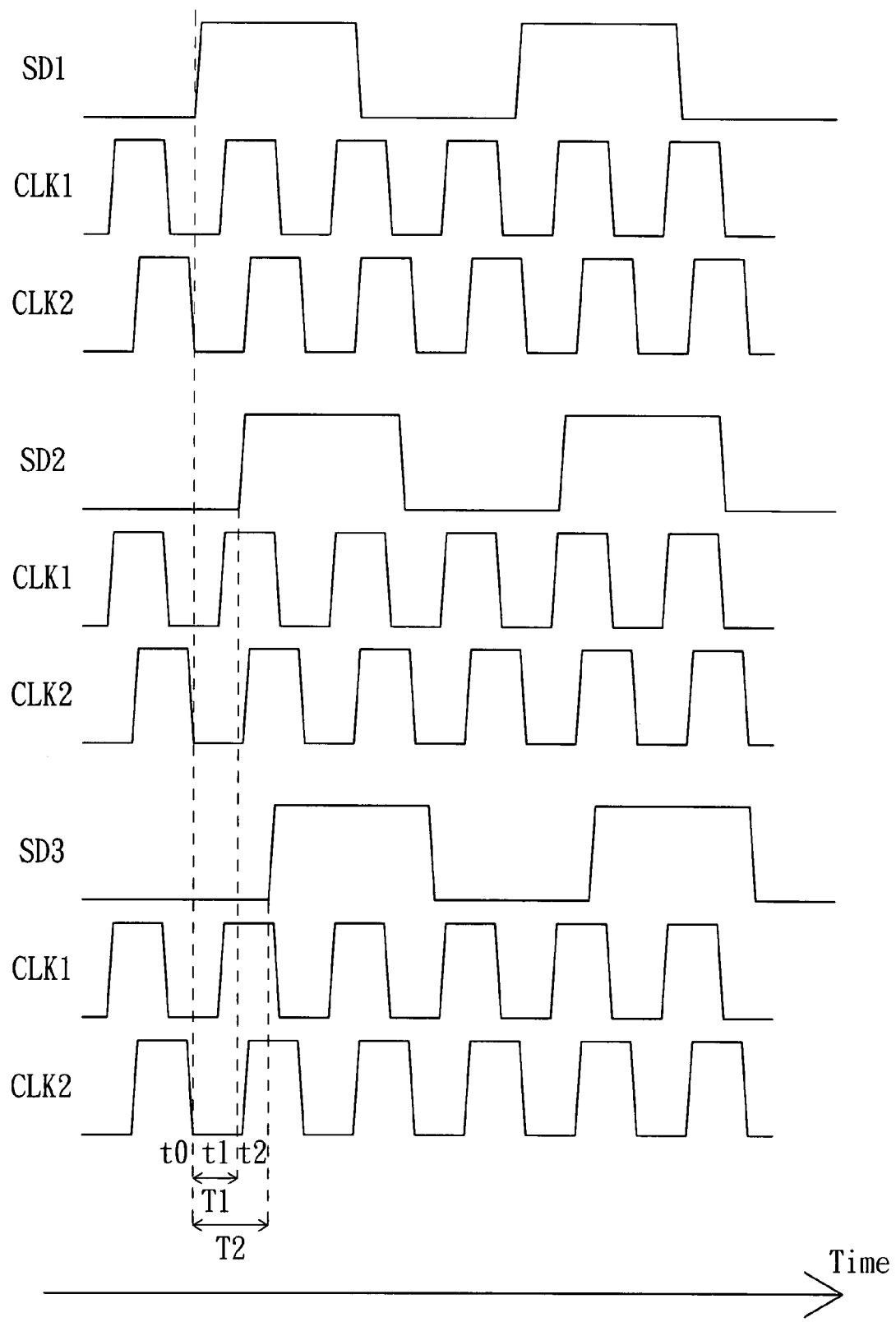
FIG. 3 is a timing diagram of relevant signals of the phase-difference detecting apparatus of FIG. 2.

Referring to FIG. 3, a timing diagram of relevant signals of the phase-difference detecting apparatus 200 of FIG. 2 is shown. In the embodiment, the period of the detection signal SD is three times the period of the timing signals CLK1 and CLK2 for instance. In the embodiment, signal waveforms SD1, SD2 and SD3 are used to represent the signal waveforms of the detection signal SD in different time points.

The start time of the signal waveform SD1 is a time point t0, with an initial phase 0 degree. At the time, the sample value S1($n$)={1,1,0}, and S2($n$)={1,1,0}. Following that, the signal generator 210 delays phase of the detection signal SD until the time corresponding to the initial phase of the detection signal SD is substantially equal to a time point t1, and the sample value S1($n$) changes to be not equal to the previous sample value S1($n-1$), as shown in the signal waveform SD2. The delay time between the time points t1 and t0 is substantially equal to the time data T1. At the time, the sample value S1($n$)={0,1,0} and S2($n$)={1,1,0}.

Next, the signal generator 210 continues to delay the phase of the detection signal SD until the time corresponding to the initial phase of the detection signal SD is substantially equal to a time point t2, the sample value S2($n$) changes to be not equal to the previous sample value S2($n-1$) as shown in the signal waveform SD3. The delay time between the time points t2 and t0 is substantially equal to the time data T2. At the time, the sample value S2($n$)={0,1,0} and S1($n$)={0,1,0}.

For example, the sample values S1($n$) and S2($n$) are respectively changed when the positive-edge sampling time points of the timing signals CLK1 and CLK2 substantially coincide with the level-transition time point of the detection signal SD. In the embodiment, the time points t1 and t2 are respectively the time points when the level transition time point of the detection signal SD from low to high coincides with positive edges of the timing signals CLK1 and CLK2. Therefore, the phase-difference detecting apparatus 200 of the embodiment can obtain the time difference of the positive-edge sampling time points of the timing signals CLK1 and CLK2 and the phase difference thereof based on the time difference of the time points t0 and t1 and that of the time points t0 and t2, which are the time data T1 and T2, respectively.

The sample unit 220 includes flip-flops 222 and 224. For example, the flip-flops 222 and 224 of the embodiment are D-type positive-edge sampling flip-flops. The flip-flop 222 is for receiving the detection signal SD and the timing signal CLK1 and sampling the detecting signal SD by the timing signal CLK1 to obtain the sample value S1($n$). The flip-flop 224 is for receiving the detection signal SD and the timing signal CLK2 and sampling the detecting signal SD by the timing signal CLK2 to obtain the sample value S2($n$).

The phase-difference detecting apparatus 200 further includes a register unit 240 for registering the sample values S1($n$) and S2($n$), and the previous sample values S1($n-1$) and S2($n-1$). In the embodiment, the register unit 240 includes buffers B1 and B2 for instance. The buffer B1 receives and delays the sample values S1($n$) and S2($n$) outputted by the sample unit 220 by the fixed time, and outputs the delayed sample values S1($n$) and S2($n$) to the buffer B2. The comparer 230 uses the sample values stored in the buffer B2 to be the previous sample values S1(n−1) and S2(n−1), and uses the sample values stored in the buffer B1 to be the sample values S1(n) and S2(n).

Figure 4:
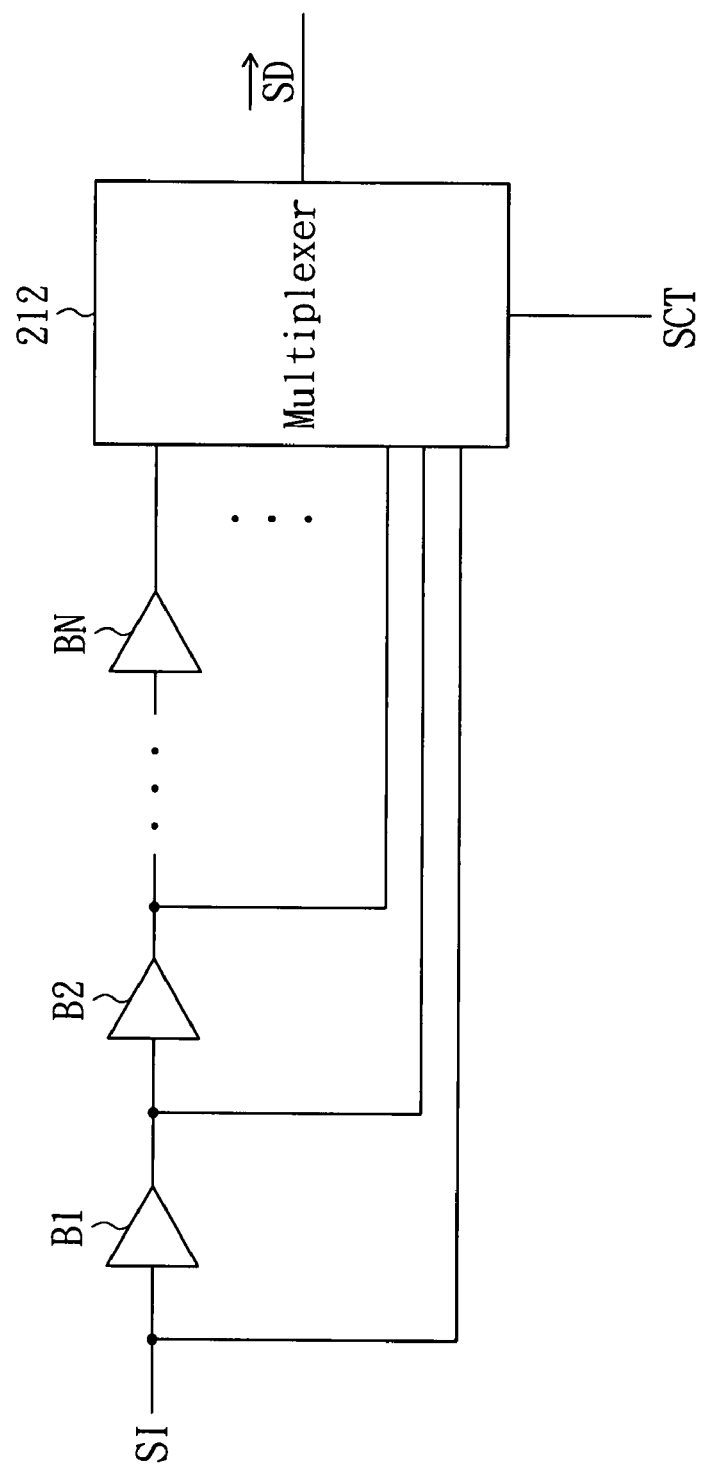
FIG. 4 is a detailed diagram of the signal generator of FIG. 2.

Referring to FIG. 4, a detailed diagram of the signal generator 210 of FIG. 2 is shown. The signal generator 210 includes N buffers B(1)~B(N) coupled to each other in series, and a multiplexer 112, wherein N is a natural number. The buffer B(1) is for receiving and delaying a start signal SI by the fixed time and outputting the delayed start signal SI. The buffers B(2)~B(N) are for respectively delaying output signals of the previous-stage buffers B(1)~B(N−1) by the fixed time and outputting the delayed output signals.

The multiplexer 212 includes N+1 input terminals for respectively receiving the start signal SI and the output signals of the buffers B(1)~B(N). The multiplexer 212 outputs one of the start signal SI and the output signals of the buffers B(1)~B(N) to the sample unit 220 to be the detection signal SD in response to a selection signal SCT. In the embodiment, for example, when the selection signal SCT is 0, the multiplexer 212 outputs the start signal SI to be the detection signal SD. When the selection signal SCT is 1~N, the multiplexer 212 respectively outputs the output signals of the buffers B(1)~B(N) to be the detection signal SD.

The phase-difference detecting apparatus 200 further includes a counter 250 for receiving the control signal SC outputted by the comparer 230 and accordingly adding up the selection signal SCT. The counter 250 is for outputting the selection signal SCT to the signal generator 210. An initial value of the selection signal SCT is substantially equal to 0. For example, the counter 250 determines how many times of the fixed time the total delay time of the detection signal SD is according to the aggregated value so as to calculate the time data T1 and T2.

In practical applications, it is easier to generate the detection signal SD with lower frequency, adjustable phase delay and each phase delay substantially smaller than 2π/20 than to generate the sample signal SS with frequency very much higher than that of the timing signal CK1 required in the conventional phase-difference detecting apparatus 100. For example, in a 0.18 micron process and the hardware condition that the frequency of the timing signal is substantially equal to 200 MHz, it is very difficult to generate the sample signal SS with frequency close to 20 times of 200 MHz, i.e. about 4 GHz. In the same hardware condition, the detection signal SD with frequency substantially lower than or equal to 200 MHz, which can be delayed by the fixed time at a time, can be easily generated by using the structure of the signal generator 210 of FIG. 4 combined with the buffer having about 0.2 nanosecond of delay time in the 0.18 micron process.

Therefore, the phase-difference detecting apparatus 200 of the embodiment can detect the phase difference between the timing signals CLK1 and CLK2 by using the detection signal SD which is easily generated, has low-frequency and can be delayed by the fixed time to improve the issue of the conventional phase-difference detecting apparatus 100 requiring difficulty-implemented and high-frequency sample signal SS to precisely measure the phase difference between the timing signals CK1 and CK2.

Figure 5:
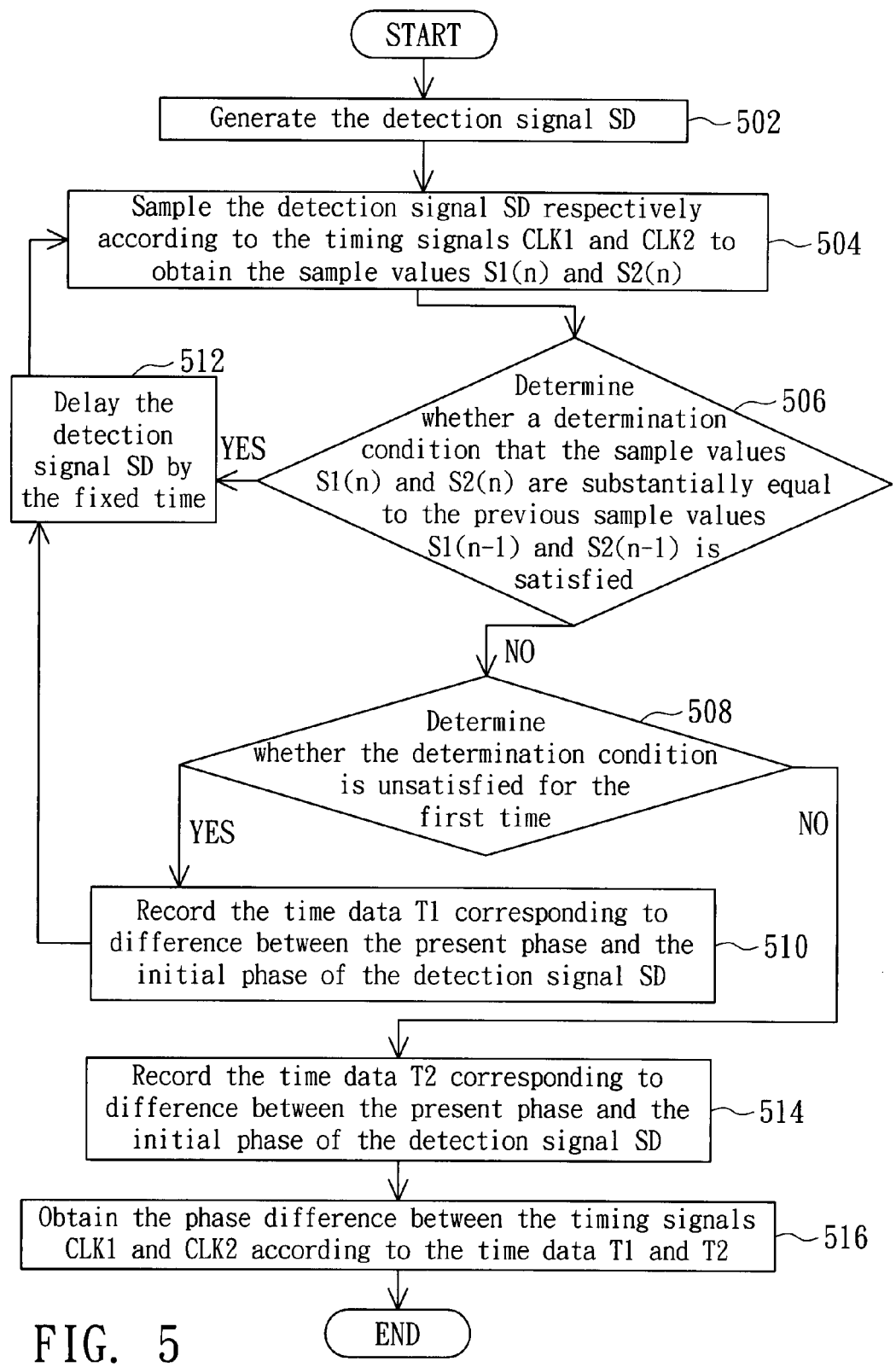
FIG. 5 is a flow chart of a phase-difference detecting method according to the preferred embodiment of the invention.

Referring to FIG. 5, a flow chart of a phase-difference detecting method according to the preferred embodiment of the invention is shown. First, in step 502, the signal generator 210 generates the detection signal SD whose period is substantially three times the period of the timing signals CLK1 and CLK2. Following that, in step 504, sample the detection signal SD respectively according to the timing signals CLK1 and CLK2 to obtain the sample values S1(n) and S2(n). Next, in step 506, determine whether a determination condition that the sample value S1(n) is substantially equal to the previous sample value S1(n−1) and the sample value S2(n) is substantially equal to the previous sample value S2(n−1) is satisfied.

In step 508, when the above determination condition is unsatisfied, determine whether the determination condition is unsatisfied for the first time. If yes, in step 510, the counter 250 records the difference between the present phase and the initial phase of the detection signal SD and the corresponding time data T1. The counter 250 determines how many times of the fixed time total delay time of the detection signal SD is according to the aggregated value so as to calculate the corresponding time data T1. Afterwards, the signal generator 210 delays the detection signal SD by the fixed time in step 512 and samples the detection signal SD according to the timing signals CLK1 and CLK2 again in step 504.

In the step 508, if the determination condition is unsatisfied and is not unsatisfied for the first time, execute the step 514 in which the counter 250 records difference between the present phase and the initial phase of the detection signal SD and the corresponding time data T2. Then, in step 516, obtain the phase difference between the timing signals CLK1 and CLK2 according to the time data T1 and T2 and the period of the timing signal CLK1. In the step 516, the phase difference between the timing signals CLK1 and CLK2 is obtained by dividing the difference of the time data T1 and T2 by the period of the timing signal CLK1. In the step 506, if the above determination condition is satisfied, execute the step 512.

In the embodiment, although the period of the detection signal SD is exemplified to be substantially equal to three times the period of the timing signals CLK1 and CLK2 for illustration, the period of the detection signal SD of the embodiment is not limited to being three times the period of the timing signals CLK1 and CLK2, and the detection signal SD can have a period larger than or equal to the period of the timing signals CLK1 and CLK2. The period of the detection signal SD is preferably an integral time of the period of the timing signals CLK1 and CLK2.

In the embodiment, although the delay time of the detection signal SD is exemplified to be one twentieth of the period of the timing signals CLK1 and CLK2 for illustration, the delay time of the detection signal SD is not limited to being equal to one twentieth of the period of the timing signals CLK1 and CLK2, and can be substantially smaller than one twentieth of the period of the timing signals CLK1 and CLK2. For example, the delay time of the detection signal SD is substantially equal to one fiftieth of the period of the timing signals CLK1 and CLK2 so that the phase-difference detecting apparatus 200 can detect the phase difference more precisely.

The phase-difference detecting apparatus and method of the embodiment sample the detection signal whose phase can be delayed respectively according to two timing signals to obtain sample values, and finds out time difference and phase difference between the rising edges of the two timing signals according to the sample values. Therefore, the phase-difference detecting apparatus and method of the embodiment can effectively improve the issues of the conventional phase-difference detecting apparatus requiring difficulty-implemented, high-frequency and high-cost sample signal to detect phase difference between two timing signals and resulting in larger variation of phase-difference detection result due to over-low frequency of the sample signal. The phase-difference detecting apparatus and method of the embodiment has the advantages that the phase difference between two timing signals can be detected more precisely by using a detection signal easily implemented with lower frequency and cost.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase-difference detecting apparatus, for detecting phase difference between a first signal and a second signal, the first signal and the second signal having substantially the same frequency, the phase-difference detecting apparatus comprising:
    a signal generator, for generating a detection signal and delaying the detection signal by a fixed time in response to a control signal;
    a sample unit, for respectively sampling the detection signal according to the first signal and the second signal to generate a first sample value and a second sample value; and
    a comparer, for comparing the first sample value with a previous first sample value and comparing the second sample value with a previous second sample value, wherein when the first sample value is substantially equal to the previous first sample value and the second sample value is substantially equal to the previous second sample value, the comparer generates the control signal to drive the signal generator to delay the detection signal by the fixed time;
    wherein when the first sample value is not equal to the previous first sample value, the phase-difference detecting apparatus records a first time corresponding to difference between the present phase and an initial phase of the detection signal;
    wherein when the second sample value is not equal to the previous second sample value, the phase-difference detecting apparatus records a second time corresponding to difference between the present phase and the initial phase of the detection signal;
    wherein the phase-difference detecting apparatus obtains the phase difference between the first signal and the second signal according to the first time and the second time.

2. The phase-difference detecting apparatus according to claim 1, further comprising a register unit, wherein the register unit comprises:
    a first buffer;
    a second buffer, for receiving and delaying the first sample value and the second sample value by the fixed time and outputting the first sample value and second sample value, which are delayed to the first buffer;
    wherein the comparer respectively accesses the first and the second sample values in the first register as the previous first sample value and the previous second sample value and respectively accesses the first and the second sample values in the second buffer as the first sample value and the second sample value.

3. The phase-difference detecting apparatus according to claim 1, wherein the sample unit comprises:
    a first flip-flop, for receiving the detection signal and the first signal and sampling the detection signal according to the first signal to obtain the first sample value; and
    a second flip-flop, for receiving the detection signal and the second signal and sampling the detection signal according to the second signal to obtain the second sample value.

4. The phase-difference detecting apparatus according to claim 1, further comprising:
    a counter, for receiving the control signal and adding up a selection signal in response to the control signal.

5. The phase-difference detecting apparatus according to claim 4, wherein the signal generator comprises:
    a plurality of stages of buffers, comprising a first stage of buffer for receiving and delaying a start signal by the fixed time and outputting the delayed start signal, wherein the buffers are for respectively delaying output signals of the previous-stage buffers by the fixed time and outputting the delayed output signals; and
    a multiplexer, comprising a plurality of input terminals for respectively receiving the start signal and the output signals of the buffers, wherein the multiplexer outputs one of the output signals of the buffers and the start signal to be the detection signal in response to the selection signal.

6. The phase-difference detecting apparatus according to claim 4, wherein the counter determines and records how many times of the fixed time the first time and the second time are substantially equal to according to the selection signal.

7. The phase-difference detecting apparatus according to claim 1, wherein the phase difference between the first signal and the second signal is substantially equal to subtraction of difference between the first time and the second time by a period of the first signal.

8. The phase-difference detecting apparatus according to claim 7, wherein the period of the detection signal is an integral time of the period of the first signal.

9. The phase-difference detecting apparatus according to claim 1, wherein the frequency of the detection signal is smaller than or equal to the frequency of the first signal.

10. A phase-difference detecting method, for detecting phase difference between a first signal and a second signal, the first signal and the second signal having substantially the same frequency, the detecting method comprising:
    generating a detection signal;
    sampling the detection signal respectively according to the first signal and the second signal to obtain a first sample value and a second sample value;
    determining whether a determination condition that the first sample value is substantially equal to a previous first sample value and the second sample value is substantially equal to a previous second sample value is satisfied;
    when the determination condition is unsatisfied, determining whether the determination condition is unsatisfied for the first time;
    when the determination condition is unsatisfied for the first time, recording difference between the present phase and an initial phase of the detection signal and a first time corresponding to the phase difference;
    when the determination condition is unsatisfied and is not unsatisfied for the first time, recording difference between the present phase and the initial phase of the detection signal and a second time corresponding to the phase difference; and
    obtaining the phase difference between the first signal and the second signal according to the first time and the second time.

11. The detecting method according to claim 10, wherein after the step of recording the first time, the method further comprises:

delaying the detection signal by a delay time, and repeatedly executing the step of sampling the detection signal respectively according to the first signal and the second signal.

12. The detecting method according to claim 11, wherein after the step of determining whether the determination condition is satisfied, the method further comprises:

if yes, executing the step of delaying the detection signal by the delay time.

13. The detecting method according to claim 10, wherein in the step of obtaining the phase difference between the first signal and the second signal according to the first time, the second time and a period of the first signal, the phase difference between the first signal and the second signal is obtained by dividing difference of the first time and the second time by the period of the first signal.

* * * * *